United States Patent
Van Bezooijen et al.

(10) Patent No.: US 7,482,873 B2
(45) Date of Patent: Jan. 27, 2009

(54) PRESERVING LINEARITY OF A RF POWER AMPLIFIER

(75) Inventors: Adrianus Van Bezooijen, Nijmegen (NL); Christophe Chanlo, Nijmegen (NL)

(73) Assignee: NXP B.V., Eindhoven (NL)

( * ) Notice: Subject to any disclaimer, the term of this patent is extended or adjusted under 35 U.S.C. 154(b) by 256 days.

(21) Appl. No.: 10/527,775

(22) PCT Filed: Aug. 4, 2003

(86) PCT No.: PCT/IB03/03422

§ 371 (c)(1),
(2), (4) Date: Mar. 14, 2005

(87) PCT Pub. No.: WO2004/027990

PCT Pub. Date: Apr. 1, 2004

(65) Prior Publication Data

US 2005/0270105 A1 Dec. 8, 2005

(51) Int. Cl.
*H03G 3/10* (2006.01)
(52) U.S. Cl. .............. 330/285; 330/278; 455/121; 455/120; 455/108; 455/123; 455/126
(58) Field of Classification Search .......... 455/299, 455/127.1, 572, 114.3, 280, 291, 311; 330/285, 330/278
See application file for complete search history.

(56) References Cited

U.S. PATENT DOCUMENTS

| | | | |
|---|---|---|---|
| 4,312,032 A | | 1/1982 | Kirby |
| 5,204,637 A | * | 4/1993 | Trinh .......................... 330/129 |
| 5,442,322 A | | 8/1995 | Kornfeld et al. |
| 6,064,266 A | | 5/2000 | Anderson et al. |
| 6,134,424 A | * | 10/2000 | Nishihori et al. ......... 455/127.1 |
| 6,191,653 B1 | * | 2/2001 | Camp et al. .................. 330/129 |
| 6,532,357 B1 | * | 3/2003 | Ichikawa ..................... 455/126 |
| 6,678,507 B1 | * | 1/2004 | Kurokawa et al. ........ 455/127.1 |
| 6,725,027 B1 | * | 4/2004 | Tsuji et al. ................... 455/296 |
| 6,980,780 B2 | * | 12/2005 | Chen et al. ............... 455/127.1 |
| 2004/0176052 A1 | * | 9/2004 | Vilhonen et al. ......... 455/127.1 |

* cited by examiner

*Primary Examiner*—Nay A Maung
*Assistant Examiner*—Richard Chan
(74) *Attorney, Agent, or Firm*—Peter Zawilski

(57) ABSTRACT

A method and circuit for preserving linearity of a RF power amplifier, the power amplifier including a RF power output unit (4, 24, 62) having a characteristic drive level and fed by a supply voltage, comprising measuring the output voltage of the RF power output unit (4, 24, 62); comparing the measured output voltage to at least one threshold voltage to produce a control signal; and adapting the drive level or the supply voltage of the RF power output (4, 24, 62) unit by means of the control signal to operate the output unit below its saturation level. A method and circuit for stabilizing an antenna circuit comprising a RF power amplifier and a matching circuit by preserving linearity of a RF power amplifier, where the above power amplifier is used.

9 Claims, 3 Drawing Sheets

PRESERVING LINEARITY OF A RF POWER AMPLIFIER

The invention relates to methods and circuits for preserving the linearity of a RF power amplifier as used for example in RF antenna circuits.

RF antennas as for instance applied in mobile phones, operate in strongly varying environments, resulting in a varying antenna input impedance, a VSWR (Voltage Standing Wave Ratio) of 4:1 is not uncommon. Especially at high output levels this may result in a severe distortion of for instance a CDMA, TDMA, Edge or W-CDMA modulated carrier signal having a non-constant envelope. The main cause of distortion is collector voltage saturation of the RF output transistor that occurs when the collector load impedance is relatively high. The conventional solution to protect the power amplifier of a cellular phone against antenna mismatch conditions to preserve linearity is to use a circulator. The circulator secures proper 50 Ohm loading of the power amplifier under antenna mismatch conditions by dissipating the reflected power in the isolator or in the third circulator port termination. Directivity in the power flow is created by ferromagnetic material.

An other known approach is to apply a fully adaptive system based on the polar or cartesian loop. Such adaptive systems are described in literature. Disadvantages of this approach are the resulting rather high complexity and the required accurate high speed signal processing, operating at RF frequencies, which leads to a high power consumption.

The above aspects of the state of the art are described in more detail with reference to FIG. 1 which shows a basic block diagram used for a power source isolated with a circulator from a mismatched antenna. The current source and its impedance Zo represents an ideal power source (RF-transistor).

Thanks to a circulator the reflected power from the antenna is not reflected towards the source, but dissipated into the circulator load. Consequently $P_{refl\_circ}$ and $P_{refl\_source}$ as well as $V_{source}$ and $I_{source}$ are zero. This avoids extremes that would occur when incident and reflected waves could add up in-phase. However, if it is assumed that $P_{rad}$ has to be maintained constant (under control of field strength indication at the base station) the incident power has to be increased to overcome reflection losses resulting in enhanced signal voltage and current at the source. Thus, a circulator only partly preserves power amplifier linearity under antenna mismatch conditions.

Table 1 below shows typical figures for an impedance matching network insertion loss $II_{match}$ of 0.7 dB, a circulator insertion loss $II_{circ}$ of 0.3 dB, a radiated output power $P_{rad}$ of 28.5 dBm and a nominal source load impedance Zo of 2 Ohm. The figures relate to a power amplifier output with circulator for Pout=28 dBm and Zo=2 Ohm.

TABLE 1

| VSWR$_{ant}$ | Γant | Γmatch | Prad/Pinc_source Lin. | Prad/Pinc_source [dB] | v or i_source_max/ v$^+$ or i$^+$_source Lin. | v or i_source_max/ v$^+$ or i$^+$_source [dB] | Pinc_source [W] | Pinc_source [dBm] | v_source_ max [Vrms] | i_source_ max [Arms] |
|---|---|---|---|---|---|---|---|---|---|---|
| 1 | 0 | 0 | 0.80 | −1.0 | 1 | 0 | 0.891 | 29.5 | 1.33 | 0.667 |
| 2 | 0.33 | 0 | 0.71 | −1.5 | 1 | 0 | 0.993 | 30.0 | 1.41 | 0.705 |
| 3 | 0.5 | 0 | 0.60 | −2.2 | 1 | 0 | 1.180 | 30.7 | 1.53 | 0.768 |
| 4 | 0.6 | 0 | 0.51 | −2.9 | 1 | 0 | 1.380 | 31.4 | 1.66 | 0.831 |
| 6 | 0.71 | 0 | 0.40 | −4.0 | 1 | 0 | 1.785 | 32.5 | 1.89 | 0.945 |
| ∞ | 1 | 0 | 0 | −∞ | 1 | 0 | ∞ | ∞ | ∞ | ∞ |

As the figures in Table 1 show, mismatch at the antenna does result in increased incident signal voltage and current at the source. For instance, for an VSWR of I the average source voltage equals 1.33 V rms or 1.89 Vpk. In edge the modulation peak-to-average ratio is about 3.2 dB which results in an RF peak voltage of 2.73V which just about fits within a 3V supply and 0.3V collector saturation voltage. For an VSWR of 6 the RF peak voltage becomes 1.89*1.414*1.445=3.86V which does not fit within a 3V supply.

In case of an power amplifier without a circulator, see FIG. 2, antenna impedance variations result in load variations of the source. The maximum source voltage as well as source current is enhanced significantly when the incident and reflected wave are in phase.

The Table 2 below shows typical figures for a $II_{match}$ of 0.7 dB and $P_{rad}$ of 28.5 dBm and Zo=2 Ohm

TABLE 2

| VSWR$_{ant}$ | Γant | Γmatch | Prad/Pinc_source Lin. | Prad/Pinc_source [dB] | v or i_source_max/ v$^+$ or i$^+$_source Lin. | v or i_source_max/ v$^+$ or i$^+$_source [dB] | Pinc_source [W] | Pinc_source [dBm] | v_source_ max [Vrms] | i_source_ max [Arms] |
|---|---|---|---|---|---|---|---|---|---|---|
| 1 | 0 | 0 | 0.85 | −0.7 | 1 | 0 | 0.832 | 29.2 | 1.29 | 0.64 |
| 2 | 0.33 | 0.28 | 0.76 | −1.2 | 1.28 | 2.1 | 0.933 | 29.7 | 1.75 | 0.87 |
| 3 | 0.5 | 0.42 | 0.64 | −1.9 | 1.42 | 3.0 | 1.096 | 30.4 | 2.10 | 1.05 |
| 4 | 0.6 | 0.51 | 0.54 | −2.6 | 1.51 | 3.6 | 1.288 | 31.1 | 2.42 | 1.21 |
| 6 | 0.71 | 0.61 | 0.42 | −3.7 | 1.61 | 4.1 | 1.659 | 32.2 | 2.93 | 1.47 |
| ∞ | 1 | 0.85 | 0 | −∞ | 1.85 | 5.3 | ∞ | ∞ | ∞ | ∞ |

For instance, at a VSWR of 4:1 the maximum voltage that can occur at the source is a factor 1.51 (3.6 dB) larger than under 50 Ohm conditions. In this case approx. 31.1–29.2=1.9 dB signal enhancement is due to compensation of the reflection losses and approx. 1.7 dB due to the reflected signal $v^-_{source}$.

The average source voltage, in this case, equals 2.42Vrms whereas the collector voltage is only 1.66Vrms when a circulator is used (see Table 1). Therefore, at an VSWR of 4:1 a power amplifier without circulator can deliver approximately 20*log(2.42/1.66)=3.3 dB less power for similar maximum signal voltage and current at the source than a power amplifier with circulator.

The problems of preserving the linearity of a RF power amplifier as used for example in RF antenna circuits are also addressed in literature, and some samples are given below.

U.S. Pat. No. 6,064,266 discloses a load limiting circuit and method for limiting the output impedance seen by an amplifier, wherein a load limiting impedance, preferably a resistor, is selectively coupled in parallel with the output impedance by a switch circuit, when a threshold detect circuit detects the value of the output impedance rising above a predetermined value. The output impedance is preferably measured by monitoring the output current through a resistor connected in series with the output impedance.

U.S. Pat. No. 5,442,322 discloses a control circuit for a multi-stage power amplifier (such as in a portable radio transmitter) compensates for fluctuations in ambient temperature, load, signal level and power supply voltage. The control voltage is set by comparing a biasing level which is related to the amplifier input signal level to a voltage proportional to the power supply current of the last stage of the amplifier. The control voltage resulting from the comparison establishes the operating point of the last stage of the power amplifier.

U.S. Pat. No. 4,312,032 discloses an apparatus for providing a controlled dynamically programmable RF power level to the real part of a terminating load which may vary in impedance over a wide range. Imminence monitoring apparatus produces vector signals representing instantaneous measurements of the voltage and current of an RF signal supplied to a load by an RF generator. These signals which contain information on the phase relationship between the voltage and current are appropriately processed and then multiplied to produce a DC signal which represents the power of the RF signal. The DC signal is employed to control the gain of a variable gain RF amplifier connected between the RF generator and the immittance monitoring apparatus. A feedback control loop is thus provided which controls the power of the RF signal supplied to the load. By amplifying, or attenuating, the signals present at some point in the control loop, the amount of power delivered to the load may be selectively varied.

It is an object of the invention to provide methods and circuits for preserving the linearity of a RF power amplifier as used for example in RF antenna circuits whereby the power amplifier can perform, under predetermined load variation, substantially as good as with known isolation by circulators or separate isolators.

The above object is achieved by a method for preserving linearity of a RF power amplifier, the power amplifier including a RF power output unit having a characteristic drive level and fed by a supply voltage, comprising measuring the output voltage of the RF power output unit; comparing the measured output voltage to at least one threshold voltage to produce a control signal; and adapting the drive level or the supply voltage of the RF power output unit by means of the control signal to operate the output unit below its saturation level.

It is possible to keep the RF power output unit, in particular the collector of the RF output transistor, out of saturation by detecting the output voltage, in particular the peak minimum collector voltage, of the RF power output unit and, if necessary, by adapting the power amplifier drive level or the power amplifier supply voltage. This will preserve the linearity of the power amplifier.

In a preferred embodiment of the above method where power amplifier includes a variable gain preamplifier supplying the drive voltage to the RF power output unit, the control signal is used to adapt the gain of the preamplifier. The variable gain preamplifier is used to keep the RF power output unit out of saturation and thus preserving the linearity of the RF power output unit.

In a preferred embodiment of the above method the control signal is combined with the gain control signal of the preamplifier which is an advantageous way of feeding the control signal to then pre-amplifier.

The above object is achieved by a method for controlling an antenna circuit comprising a RF power amplifier and a matching circuit by preserving linearity of a RF power amplifier, the power amplifier comprising a RF power output unit having a characteristic drive level and fed by a supply voltage source, comprising measuring the output voltage of the RF power output unit; comparing the measured output voltage to at least one threshold voltage to produce a control signal; and adapting the output matching circuit by means of the control signal to operate the output unit below its saturation level.

It is possible to keep the RF power output unit, in particular the collector of the RF output transistor, out of saturation by detecting the output voltage, in particular the peak minimum collector voltage, of the RF power output unit.

In a preferred embodiment of the above method the adapting of the output matching circuit is done by changing either the magnitude or the phase of the impedance transform function. The advantageous feature is that the magnitude and the phase are controlled in order to preserve the linearity of the RF power output unit.

In a preferred embodiment of the above method the adapting of the output matching circuit and the adapting of the supply voltage are combined with a power amplifier efficiency optimization in case of a multiple threshold detection by an analog-to-digital converter. The use of an analog-to-digital converter which may be a part of the base-band controller, allows a precise adapting of the output matching circuit and the supply voltage.

In a preferred embodiment of the above method the output voltage of the RF power output unit is rectified before being compared to the threshold voltage in order to have a direct influence on the operating condition of the power amplifier.

In a preferred embodiment of the above method the output voltage of the RF power output unit is compared to the threshold voltage by means of an operational amplifier. The advantage is that the operational amplifier compares the output voltage to the threshold voltage and amplifies automatically the difference between the two compared voltages.

In a preferred embodiment of the above method the output voltage of the RF power output unit is compared in at least two parallel operational amplifiers to threshold voltages to produce at least two control signals, and wherein the at least two control signals are fed to the base-band controller. The use of at least two parallel operational amplifiers enables to determine more accurately the minimum collector voltage in order to preserve the linearity of the RF power output unit.

In a preferred embodiment of the above method the at least two threshold voltages have different voltage levels. The different voltage levels of the at least two threshold voltages enable to determine the minimum collector voltage of the RF power output unit in order to preserve the linearity of the RF power output unit.

In a preferred embodiment of the above method the supply voltage is adapted by a programmable DC-DC converter controlled by a base-band controller which is fed by the control signal. A programmable DC-DC converter controlled by a base-band controller is an advantageous way for a supply voltage adaptation.

The above object is achieved by a circuit for preserving linearity of a RF power amplifier wherein the power amplifier includes a RF power output unit having a characteristic drive level, comprising a measuring unit measuring the output voltage of the RF power output unit; a comparing unit comparing the measured output voltage of the RE power output unit to a threshold voltage to produce a control signal; a drive level adaptation unit adapting the drive level of the RF power output unit or a supply voltage adaptation unit adapting a supply voltage of the RE power output unit to operate the output unit below its saturation level for preserving linearity of the RE power amplifier.

It is possible to keep the RF power output unit, in particular the collector of the RF output transistor, out of saturation by detecting the output voltage, in particular the peak minimum collector voltage, of the RF power output unit. This will preserve the linearity of the power amplifier.

In a preferred embodiment of the above circuit the power amplifier includes a variable gain preamplifier supplying the drive voltage to the RF power output unit; and wherein the control signal is fed from the comparing unit to the preamplifier to adapt the gain of the preamplifier. The variable gain preamplifier is used to keep the RF power output unit out of saturation and thus preserving the linearity of the RF power output unit.

In a preferred embodiment of the above circuit a combining circuit is provided between the comparing unit and the preamplifier combining the control signal with the gain control signal of the preamplifier.

The above object is achieved by a circuit for stabilizing an antenna circuit comprising a RE power amplifier and a matching circuit, wherein the RF power amplifier comprises a RF power output unit having a characteristic drive level, comprising a measuring unit measuring the output voltage of the RF power output unit; a comparing unit comparing the measured output voltage of the RF power output unit to a threshold voltage to produce a control signal; a drive level adaptation unit adapting the output matching circuit by means of the control signal thereby adapting the drive level of the RF power output unit to operate the RF output unit below its saturation level for preserving linearity of the RE power amplifier.

It is possible to keep the RF power output unit, in particular the collector of the RF output transistor, out of saturation by detecting the output voltage, in particular the peak minimum collector voltage, of the RF power output unit and, if necessary, by adapting the power amplifier output matching circuit. This will preserve the linearity of the power amplifier.

In a preferred embodiment of the above circuit the output matching circuit is configured to be adaptable with respect to either the magnitude or the phase of its impedance transform function. The advantageous feature of the output matching circuit is that the magnitude and the phase are controlled independently in order to preserve the linearity of the RF power output unit.

In a preferred embodiment of the above circuit a rectifier is provided between the RF power output unit and the comparing unit.

In a preferred embodiment of the above circuit the comparing unit comprises an operational amplifier.

In a preferred embodiment of the above circuit at least two parallel operational amplifiers are provided to produce at least two control sub-signals, and wherein the at least two control sub-signals are fed to the RF power output unit to adapt the gain thereof.

In a preferred embodiment of the above circuit the at least two threshold voltages have different voltage levels.

In a preferred embodiment of the above circuit there are provided a DC-DC converter providing the supply voltage to the RF power output unit; and a base-band controller between the comparing unit and the DC-DC converter which base-band controller is fed by the control signal whereby the supply voltage is adapted.

In a preferred embodiment of the above circuit the output matching circuit comprises at least one load switching circuit.

In a preferred embodiment of the above circuit the load switching circuit comprises at least one PIN diode and at least one current source. A load switching circuit that consists of one or more PIN diodes is particularly suited for adaptation of the output matching circuit.

The advantages of the circuits according to the invention and of the preferred embodiments thereof have been discussed above in connection with the methods according to the invention and of the preferred embodiments thereof.

The method of collector voltage detection can be used for linear power amplifier's as used in CDMA, W-CDMA and Edge phones. The parameter to adapt (supply voltage, output match or power drive level) is, in principle, independent of the application. However, in GSM/Edge it is common to use a power control loop. Therefore, the proposed detection method can more easily be combined with input drive level adaptation than for the other systems.

These and various other advantages and features of novelty which characterize the present invention are pointed out with particularity in the claims annexed hereto and forming a part hereof. However, for a better understanding of the invention, its advantages, and the object obtained by its use, reference should be made to the drawings which form a further part hereof, and to the accompanying descriptive matter in which there are illustrated and described preferred embodiments of the present invention.

Figure 1:
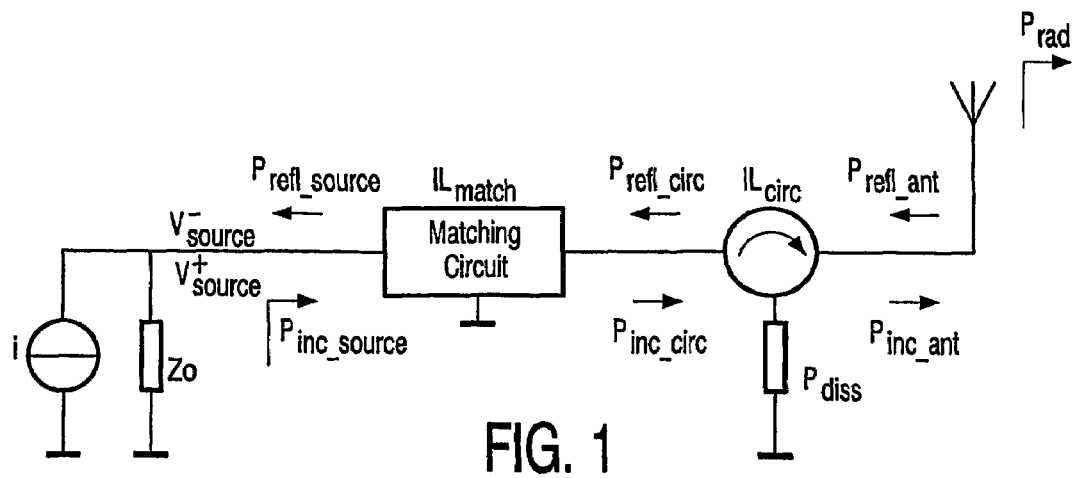
FIG. 1 shows a prior art block diagram of a power source isolated with a circulator from a mismatched antenna.
Figure 2:
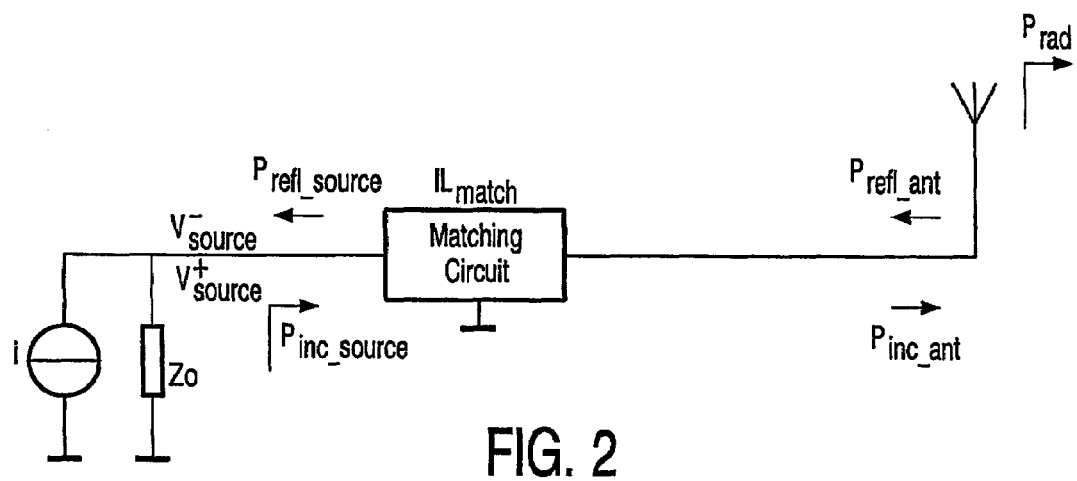
FIG. 2 shows a prior art power amplifier without a circulator.
Figure 3:
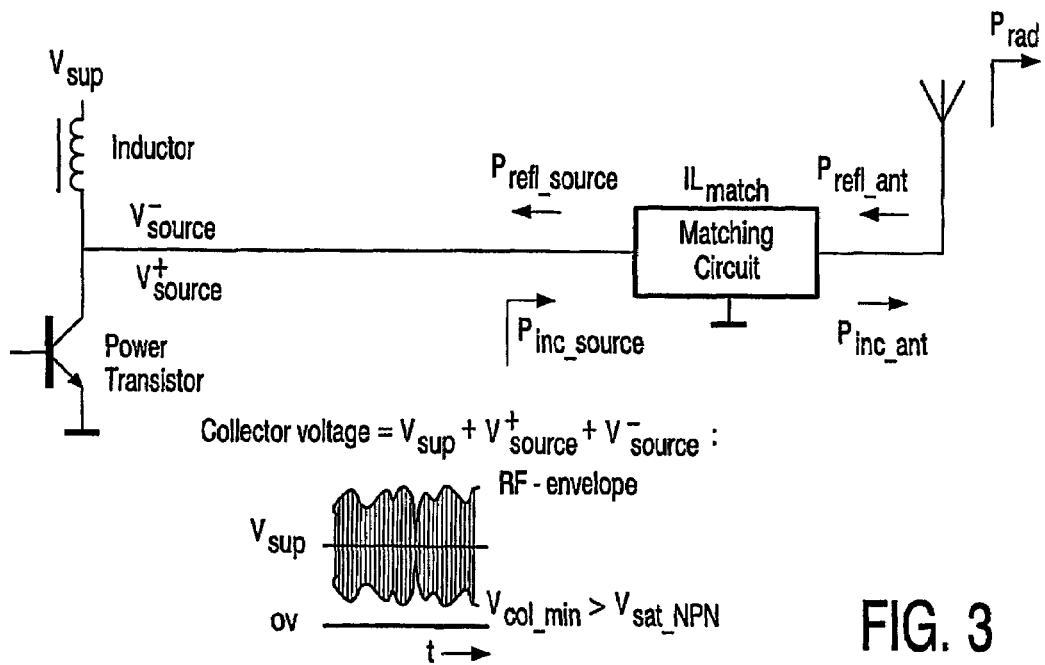
FIG. 3 shows a block diagram of a power source of an antenna circuit for a basic discussion of collector voltage saturation.

FIG. 3 shows a block diagram of a power source of an antenna circuit having a power amplifier and a matching circuit. The power amplifier that is supposed to be just linear enough at maximum output power level at a 50 Ohm antenna impedance, becomes non-linear under antenna mismatch conditions. As can be seen from FIG. 3, a main cause of distortion under antenna mismatch conditions is due to collector voltage saturation at the final stage. Collector voltage saturation of the RF-transistor occurs when the collector load impedance is relatively high in combination with high output power levels. The amount of saturation depends on the magnitude and phase of the antenna reflection coefficient Γant and on losses in the matching network.

The invention is based on the findings that the RF-transistor collector can be kept out of saturation if the minimum peak voltage at the collector is detect, the detected voltage is compared with a minimum allowable reference value and the gain of the power amplifier is reduced (adapted) to a level that just avoids "collector voltage underflow" conditions without re-introducing distortion, or increase the supply voltage of the power amplifier to a level that just avoids "collector voltage underflow" conditions by steering, preferably via the baseband controller, a DC-DC converter that supplies the power amplifier, or change the matching network between power amplifier and antenna under "collector voltage underflow" conditions to reduce the load impedance of the collector (load switch).

Figure 4:
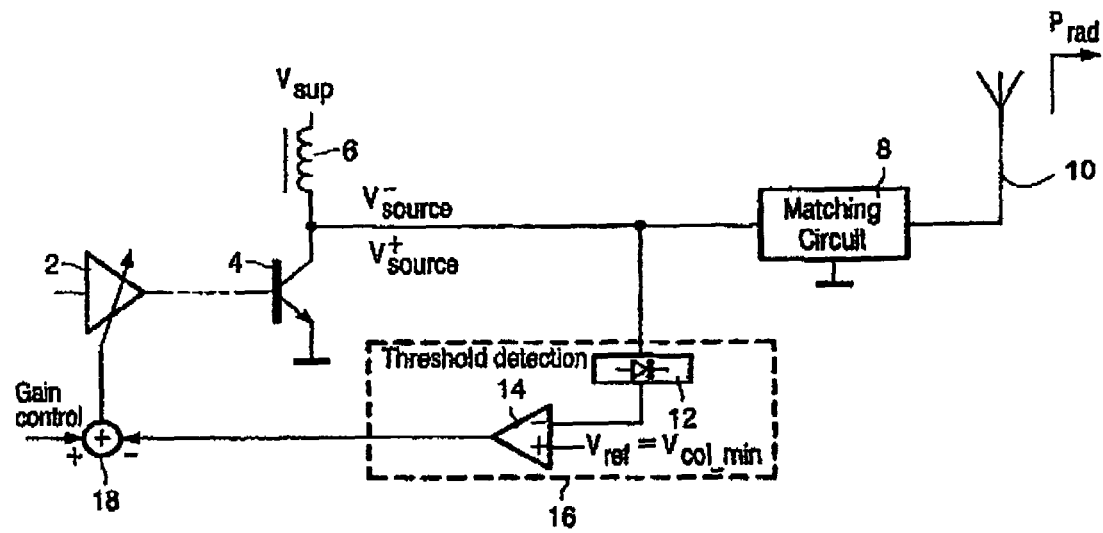
FIG. 4 shows a block diagram of a power source of an antenna circuit according to a first embodiment of the invention.

FIG. 4 shows a block diagram of a power source of an antenna circuit according to a first embodiment of the present invention. The embodiment comprises a driver 2 connected with its output terminal to a base terminal of a transistor 4. An emitter terminal of the transistor 4 is connected to ground. A collector terminal of the transistor 4 is connected to an inductance 6, a matching circuit 8 and a threshold detection unit 16. The other side of the inductance 6 is connected to a supply voltage $V_{sup}$. The matching circuit 8 is connected to an antenna 10 and with another terminal to ground. The threshold detection unit is connected to an addition point 18. The result of the addition point 18 is fed to the driver 2. The threshold detection unit 16 comprises a rectifier 12 connected on one side to the collector of the transistor 4 and on the other side to a minus terminal of an operational amplifier 14. A plus terminal of the operational amplifier 14 is connected to a reference voltage $V_{ref}$ which is equal to a minimum collector voltage $V_{col\_min}$. The output of the operational amplifier 14 is connected to the minus terminal of the addition point 18. The rectifier 12 rectifies the voltage at the collector terminal of the transistor 4 and feeds the rectified voltage to the minus terminal of the operational amplifier 14. The operational amplifier forms the difference between the rectified voltage of the rectifier 12 and the reference voltage at the plus terminal of operational amplifier 14. The amplified output voltage of the operational amplifier 14 is fed to the addition point 18. The addition point 18 forms the difference between the output voltage of the operational amplifier 14, which is subtracted from the positive output signal of the gain control. The differential signal is fed to the driver 2. Depending on the differential signal of addition point 18 the driver controls the RF-voltage at the base (drive level) of the transistor 4. By detecting the collector voltage and reducing the gain of the transistor 4 the transistor 4 will be kept out of saturation.

Figure 5:
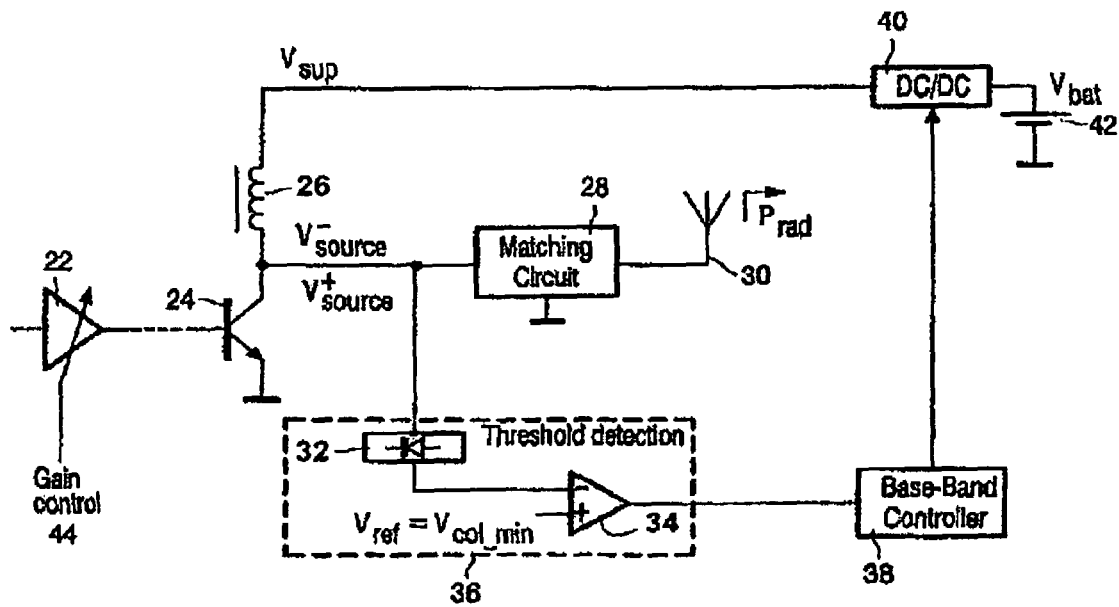
FIG. 5 shows a block diagram of a power source of an antenna circuit according to a second embodiment of the invention.

FIG. 5 shows a block diagram of a power source of an antenna circuit according to a second embodiment of the invention. The embodiment comprises a driver 22 controlled by a gain control 44, connected to a base terminal of a transistor 24. An emitter terminal of the transistor 24 is connected to ground. A collector terminal of the transistor 24 is connected to an inductance 26, a matching circuit 28 and a threshold detection unit 36. The matching circuit 28 is connected to an antenna 30 radiating the radiated power $P_{rad}$. Another terminal of the matching circuit is connected to ground. The threshold detection unit comprises a rectifier 32 connected on one side to the collector terminal of the transistor 24 and on the other side connected to a minus terminal of an operational amplifier 34. The rectifier 32 rectifies the collector voltage of transistor 24 and feeds the rectified voltage to the minus terminal of operational amplifier 34. A plus terminal of the transistor 34 is connected to a reference voltage $V_{ref}$ equal to a minimum collector voltage $V_{col\_min}$. The operational amplifier 34 amplifies the difference between the rectified collector voltage and the reference voltage. The amplified differential voltage is fed from the operational amplifier 34 of the threshold detection unit 36 to a base band controller 38. The base band controller 38 controls a DC/DC converter 40. The DC/DC converter 40 is connected on one side to a battery voltage $V_{bat}$ 42. Another terminal of the DC/DC converter 40 is connected to the other side of the inductance 26. The DC/DC converter 40 supplies the supply voltage $V_{sup}$ via the inductance 26 to the collector of the transistor 24.

In the embodiment of FIG. 5, the collector voltage of transistor 24 is detected by the threshold detection unit 36, and below a given threshold the DC/DC converter 40 provides an output voltage which is increased to keep transistor 24 out of saturation. The linearity preserving control loop comprising the threshold detection unit 36, the base band controller 38, the DC/DC converter 40 and the inductance 26 is also used as an efficiency optimization loop. At low output power levels of the transistor 24 the loop sets the DC/DC converter 40 to the corresponding minimum supply voltage and thus optimizes efficiency.

Figure 6:
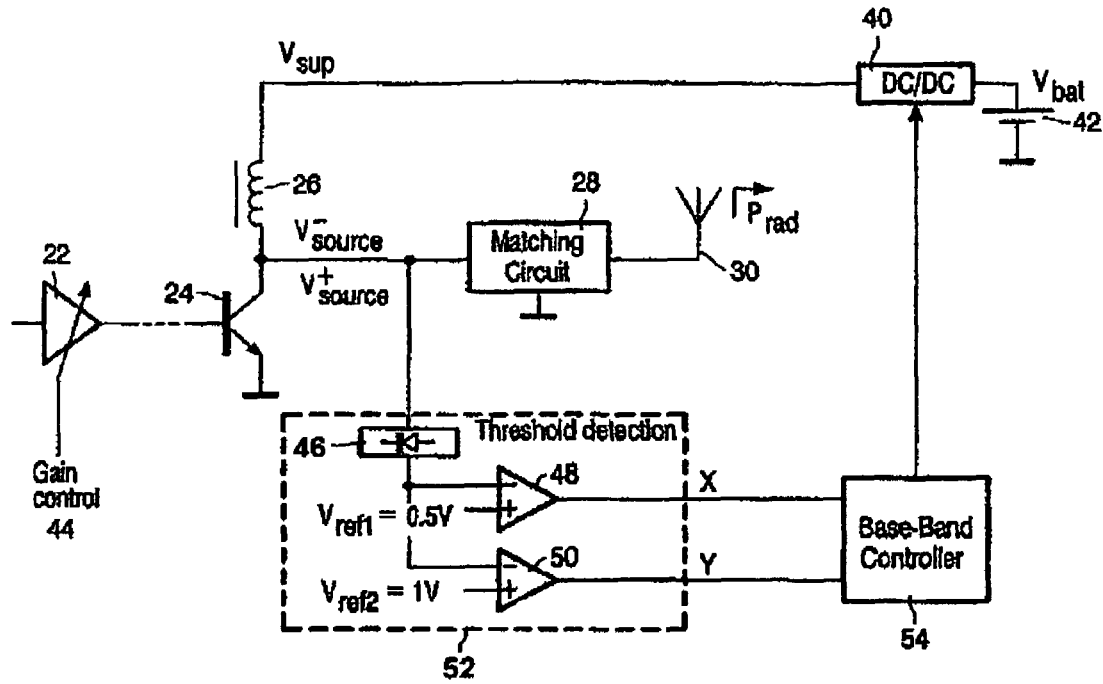
FIG. 6 shows a block diagram of a power source of an antenna circuit according to a third embodiment of the invention.

FIG. 6 shows a block diagram of a power source of an antenna circuit according to a third embodiment of the invention. The embodiment of FIG. 6 is rather similar to the embodiment of FIG. 5. Therefore equal parts have equal numbers. The differences between FIG. 6 and FIG. 5 are a different threshold detection unit 52 and a different base band controller 54. The threshold detection unit 52 comprises a rectifier 46 connected on one side to the collector of the transistor 24 and on the other side to the minus terminal of an operational amplifier 48 and to a minus terminal of an operational amplifier 50. The rectifier 46 rectifies the collector voltage of transistor 24 like the rectifier 32 in FIG. 5. The rectified voltage is fed to two operational amplifiers 48 and 50. The two operational amplifiers 48 and 50 have different reference voltages connected to their plus terminals. The operational amplifier 48 is connected to a reference voltage $V_{ref1}$ equal to 0.5 V and the plus terminal of the operational amplifier 50 is connected to a reference voltage $V_{ref2}$ equal to 1 V. The amplified differential voltage between the rectified voltage of rectifier 46 and the reference voltage is provided to the base band controller 54. The amplified differential signal X of amplifier 48 and the amplified differential voltage Y of amplifier 50 is fed to the base band controller 54. The base band controller 54 has two input terminals for the two different amplified differential voltages X and Y. The base band controller 54 controls the DC/DC converter 40 depending on the voltages X and Y.

In the embodiment shown in FIG. 6, several threshold levels instead of one threshold level in FIG. 5, are used to determine more accurately the minimum collector voltage in order to adapt the supply voltage. FIG. 6 shows a minimum configuration that allows the optimization of efficiency as well as linearity. Table 3 shows the three levels that can be distinguished.

TABLE 3

| X | Y | Condition | Remark |
|---|---|---|---|
| 0 | 0 | $V_{col\_min} > 1\ V$ | Too high for good efficiency |
| 0 | 1 | $0.5\ V < V_{col\_min} < 1\ V$ | Optimum |
| 1 | 1 | $V_{col\_min} < 0.5\ V$ | Too low for good linearity |

The usage of an analogue detector output and an analogue to digital converter allows a more analogue control of the supply voltage. The settling time of the DC/DC converter should be sufficiently short.

The base band controller 54 can use "old" threshold detection information and the "used" information on required output power to determine an optimum output voltage value for the DC/DC converter which might need adaptation when "new" threshold detection information is collected.

Figure 7:
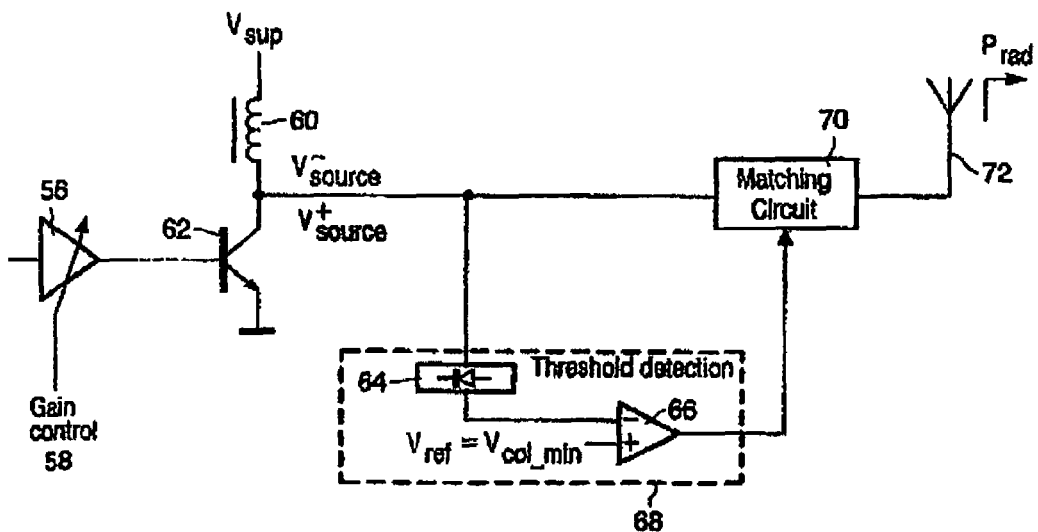
FIG. 7 shows a block diagram of a power source of an antenna circuit according to a forth embodiment of the invention.

FIG. 7 shows a block diagram of a power source of an antenna circuit according to a forth embodiment of the invention. The embodiment comprises a driver 56 controlled by a gain control 58 connected to a bias terminal of a transistor 62. An emitter terminal of the transistor 62 is connected to ground. A collector terminal of transistor 62 is connected to an inductance 60, a matching circuit 70 and a rectifier 64 of a threshold detection unit 68. The other terminal of the inductance 60 is connected to a supply voltage $V_{sup}$. The rectifier 64 rectifies the voltage at the collector terminal of transistor 62. The rectified voltage is fed to an minus terminal of an operational amplifier 66. A reference voltage $V_{ref}$ equal to a minimum collector voltage $V_{col\_min}$ is connected to a plus terminal of the operational amplifier 66. The operational amplifier amplifies the difference between the rectified voltage and the reference voltage $V_{ref}$. The amplified differential voltage is fed to the matching circuit 70. Another terminal of the matching circuit 70 is connected to an antenna 72 radiating the power $P_{rad}$.

The threshold detection unit detects the collector voltage of the transistor 62 and the matching circuit 70 is changed below a given threshold to keep the transistor 62 out of saturation. In the matching circuit 70 either the magnitude or the phase of impedance information between the output impedance of the transistor 62 and the input impedance of the antenna can be changed and vice versa.

A relatively simple adaptation mechanism changing the magnitude rather than the phase can be realized by means of a load switch changing the collector impedance from high to low when voltage underflow occurs. This load switch can be built up with a Pin diode and a current source. A smoother control can be obtained by using multiple threshold detection and by more than one switch. An advantage of adaptation of the output matching is that a relatively large radiated output power can be obtained under antenna mismatch conditions while maintaining linearity.

An implementation with multiple threshold detection levels and multiple switches can also be used to optimize the efficiency. The load line shall be increased to a minimum allowable collector peak voltage.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is defined in the language in which the appended claims are expressed. The word "comprising" does not exclude the presence of other elements or steps than those listed in a claim, and "a" or "an" does not exclude a plurality.

The invention claimed is:

1. A method for preserving linearity of a RF power amplifier, the power amplifier including a RF power output unit having a characteristic drive level and fed by a supply voltage, comprising:
   measuring the output voltage of the RF power output unit;
   comparing the measured output voltage to at least one threshold voltage to produce a control signal; and
   reducing the drive level or increasing the supply voltage of the RF power output unit by means of the control signal to operate the output unit below its saturation level,
   wherein the RF power output unit is a transistor having a base terminal connected to an output terminal of a driver unit providing the drive level and a collector terminal connected to the supply voltage through an inductance, the output voltage being measured at the transistor collector terminal.

2. The method of claim 1, wherein the at least one threshold voltage is equal to a minimum collector voltage of the transistor.

3. A circuit for preserving linearity of a RF power amplifier wherein the power amplifier includes a RF power output unit having a characteristic drive level, comprising:
   a measuring unit measuring the output voltage of the RF power output unit;
   a comparing unit comparing the measured output voltage of the RF power output unit to a threshold voltage to produce a control signal;
   a drive level adaptation unit reducing the drive level of the RF power output unit or a supply voltage adaptation unit increasing a supply voltage of the RF power output unit to operate the output unit below its saturation level for preserving linearity of the RF power amplifier,
   wherein the RF power output unit is a transistor having a base terminal connected to an output terminal of a driver unit providing the drive level and a collector terminal connected to the supply voltage through an inductance, the output voltage being measured at the transistor collector terminal.

4. The circuit of claim 3, wherein the at least one threshold voltage is equal to a minimum collector voltage of the transistor.

5. The circuit of claim 3, further comprising an RF antenna and a matching circuit coupled between the RF antenna and the collector terminal, and wherein the comparing unit is coupled between the collector terminal and the matching circuit.

6. The method of claim 1, wherein the RF power amplifier includes a variable gain preamplifier supplying the drive voltage to the RF power output unit and wherein the control signal is used to adapt the gain of the preamplifier.

7. The method of claim 6, wherein the control signal is combined with the gain control signal of the preamplifier.

8. The circuit of claim 3, wherein the power amplifier includes a variable gain preamplifier supplying the drive voltage to the RF power output unit; and wherein the control signal is fed from the comparing unit to the preamplifier to adapt the gain of the preamplifier.

9. The circuit of claim 8, comprising a combining circuit between the comparing unit and the preamplifier combining the control signal with the gain control signal of the preamplifier.

* * * * *